United States Patent
Heppner et al.

(10) Patent No.: US 10,600,999 B2
(45) Date of Patent: Mar. 24, 2020

(54) METHOD FOR PRODUCING AN ORGANIC COMPONENT

(71) Applicant: OSRAM OLED GmbH, Regensburg (DE)

(72) Inventors: Heiko Heppner, Koefering (DE); Egbert Hoefling, Regensburg (DE); Dieter Musa, Wenzenbach (DE); Simon Schicktanz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/558,576

(22) PCT Filed: Mar. 15, 2016

(86) PCT No.: PCT/EP2016/055604
§ 371 (c)(1),
(2) Date: Sep. 15, 2017

(87) PCT Pub. No.: WO2016/146642
PCT Pub. Date: Sep. 22, 2016

(65) Prior Publication Data
US 2018/0062118 A1  Mar. 1, 2018

(30) Foreign Application Priority Data
Mar. 17, 2015  (DE) .................. 10 2015 103 895

(51) Int. Cl.
*H01L 51/00* (2006.01)
*H01L 27/32* (2006.01)
(Continued)

(52) U.S. Cl.
CPC .......... *H01L 51/56* (2013.01); *H01L 27/3202* (2013.01); *H01L 27/3204* (2013.01);
(Continued)

(58) Field of Classification Search
CPC ............ H01L 51/5234; H01L 51/5206; H01L 51/5203; H01L 51/56; H01L 51/524;
(Continued)

(56) References Cited

U.S. PATENT DOCUMENTS 4,084,019 A * 4/1978 Christ .................. B05C 19/025
                                                        118/627
5,682,043 A * 10/1997 Pei ............................ F21K 2/08
                                                        257/102
(Continued)

FOREIGN PATENT DOCUMENTS

EP        2476784 A1    7/2012
JP      06160620 A  *  6/1994  ............... G02B 5/20
(Continued)

OTHER PUBLICATIONS

German Search Report based on application No. 10 2015 103 895.1 (10 pages) dated Feb. 17, 2016 (for reference purpose only).
(Continued)

*Primary Examiner* — Caridad Everhart
(74) *Attorney, Agent, or Firm* — Viering, Jentschura & Partner MBB

(57) ABSTRACT

According to the disclosure, a method for producing an organic component is provided. The method includes providing a carrier substrate; forming an electrically conductive layer on or above the carrier substrate; applying an electrical potential to the electrically conductive layer; and forming at least one organic, functional layer for forming the organic component on or above the electrically conductive layer at least partly during the process of applying the electrical potential to the electrically conductive layer.

13 Claims, 7 Drawing Sheets

(51) Int. Cl.
  *H01L 51/52* (2006.01)
  *H01L 51/56* (2006.01)
  *H01L 51/50* (2006.01)

(52) U.S. Cl.
  CPC ........ *H01L 51/003* (2013.01); *H01L 51/0006* (2013.01); *H01L 51/0021* (2013.01); *H01L 51/524* (2013.01); *H01L 51/5253* (2013.01); *H01L 51/5012* (2013.01); *H01L 51/5203* (2013.01); *H01L 51/5206* (2013.01); *H01L 51/5234* (2013.01); *H01L 51/5243* (2013.01)

(58) Field of Classification Search
  CPC ............... H01L 51/0037; H01L 51/424; H01L 51/51012; H01L 27/3225; H01L 51/5048; H01L 51/5012; H01L 2924/12044; H01L 21/6708; H01L 21/76874; H01L 21/67051; H01L 27/14621; H01L 27/3202; H01L 27/3204; H01L 25/167
  See application file for complete search history.

(56) References Cited

U.S. PATENT DOCUMENTS

| | | | | |
|---|---|---|---|---|
| 5,734,457 | A * | 3/1998 | Mitsui | G02F 1/133514 349/105 |
| 6,256,079 | B1 * | 7/2001 | Matsushima | G02F 1/133516 349/106 |
| 6,503,772 | B1 * | 1/2003 | Ohtsu | G02F 1/1362 257/E21.414 |
| 2002/0060757 | A1 * | 5/2002 | Kiguchi | G02F 1/133514 349/43 |
| 2005/0088080 | A1 * | 4/2005 | Cheng | H01L 51/5092 313/504 |
| 2005/0092982 | A1 * | 5/2005 | Mullen | C08G 61/02 257/40 |
| 2006/0068082 | A1 * | 3/2006 | Marra | G02F 1/133516 427/58 |
| 2006/0269664 | A1 | 11/2006 | Gleason et al. | |
| 2007/0063644 | A1 * | 3/2007 | Kim | H01L 51/0005 313/506 |
| 2008/0006819 | A1 | 1/2008 | McCormick et al. | |
| 2008/0017852 | A1 * | 1/2008 | Huh | H01L 51/0037 257/40 |
| 2010/0075145 | A1 * | 3/2010 | Joo | C09K 11/06 428/376 |
| 2012/0104429 | A1 | 5/2012 | Uchida et al. | |
| 2013/0240847 | A1 * | 9/2013 | Zakhidov | H01L 27/3202 257/40 |
| 2014/0001966 | A1 | 1/2014 | Cho | |
| 2018/0205028 | A1 * | 7/2018 | Scharner | H01L 51/5206 |
| 2018/0211599 | A1 * | 7/2018 | Li | G09G 3/3258 |

FOREIGN PATENT DOCUMENTS

| | | |
|---|---|---|
| JP | 2010165492 A | 7/2010 |
| WO | 0178151 A2 | 10/2001 |

OTHER PUBLICATIONS

International Search Report based on application No. PCT/EP2016/055604 (10 pages) dated Jul. 6, 2016 (for reference purpose only).
Hwang et al., "Electrospray deposition of polymer thin films for organic light-emitting diodes", Nanoscale Research Letters, 2012,Springer.

* cited by examiner

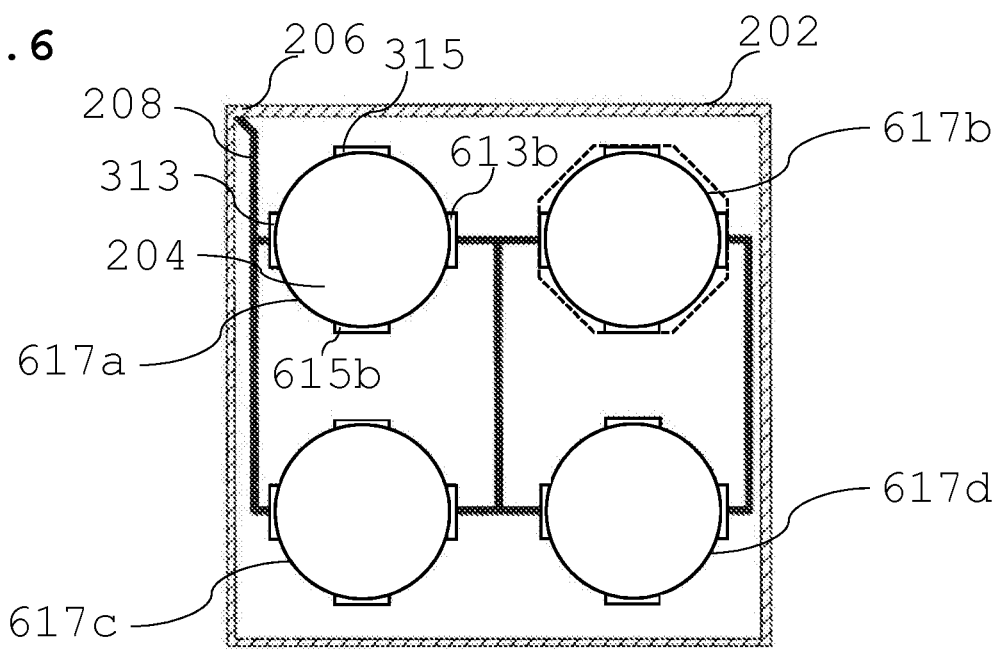
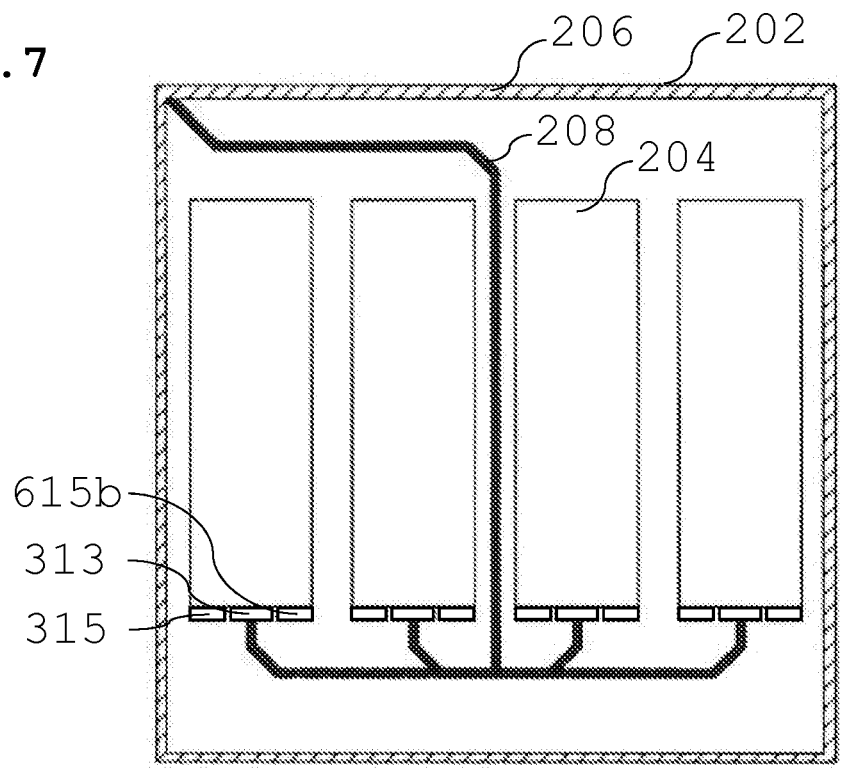

METHOD FOR PRODUCING AN ORGANIC COMPONENT

RELATED APPLICATIONS

The present application is a national stage entry according to 35 U.S.C. § 371 of PCT application No.: PCT/EP2016/055604 filed on Mar. 15, 2016, which claims priority from German application No: 10 2015 103 895.1 filed on Mar. 17, 2015, and is incorporated herein by reference in its entirety.

TECHNICAL FIELD

The present disclosure relates to a method for producing an organic component.

BACKGROUND

An organic component can be an optoelectronic component which emits or absorbs light. The organic component is for example an organic light emitting diode (OLED), a photodetector or a solar cell.

Organic components usually consist of active layers having a thickness in the range of less than 1 µm and during production are therefore particularly sensitive to contamination by particles of comparable orders of magnitude. Typical failures resulting from particles are short circuits or thin film encapsulation faults, as a result of which a total failure of the organic component can occur. Production (which includes a processing, for example) is usually carried out in a particle-reduced environment, for example in a clean room or in a vacuum. A carrier substrate, also referred to hereinafter as substrate, and a covering substrate are usually provided. Even if hereinafter glass, for example referred to as cap glass, is mentioned in the exemplary embodiments, nevertheless it should be pointed out that other materials can also be provided as a covering substrate, for example a plastics film. The carrier substrate and the covering substrate are usually transported such that the side sensitive to particles faces downward. However, contamination with particles cannot be completely avoided by means of these measures. A certain resistance of a layer to be formed vis à vis damage resulting from small particles can be achieved at the expense of higher costs resulting from the provision of a relatively thick so-called buffer layer, for example an organic buffer layer.

Usually, production of an organic component is followed by metrological detection of whether the organic component has defects caused by particles, the organic component then being sorted out, if appropriate.

SUMMARY

The object of the present disclosure is to provide a simple and efficient method for producing an organic component, wherein the organic component has the fewest possible defects caused by particles.

In accordance with one aspect of the present disclosure, the object is achieved by means of a method for producing an organic component, which method includes providing a carrier substrate. Furthermore, the method includes forming an electrically conductive layer on or above the carrier substrate and applying an electrical potential to the electrically conductive layer. Furthermore, the method includes forming at least one organic, functional layer for forming the organic component on or above the electrically conductive layer at least partly during the process of applying the electrical potential to the electrically conductive layer. Applying an electrical potential during the process of forming the at least one organic, functional layer makes it possible to minimize a potential difference between the at least one organic, functional layer and particles from the environment. It is thus possible to reduce an electrostatic attraction of particles from the environment by the at least one organic, functional layer. An organic component produced in this way can have a smaller number of defects caused by particles.

In accordance with various embodiments, the electrically conductive layer (or the material thereof) can have an electrical conductivity greater than that of the carrier substrate (or the material thereof), e.g. more than double the magnitude thereof, e.g. more than three times the magnitude thereof, e.g. more than five times the magnitude thereof, e.g. more than ten times the magnitude thereof. In other words, the electrically conductive layer can be more electrically conductive than the carrier substrate. Alternatively or additionally, the electrically conductive layer (or the material thereof) can have an electrical conductivity greater than that of the organic, functional layer, e.g. more than double the magnitude thereof, e.g. more than three times the magnitude thereof, e.g. more than five times the magnitude thereof, e.g. more than ten times the magnitude thereof.

By way of example, the electrically conductive layer can have an electrical resistance (e.g. along and/or transversely with respect to the lateral extent of the layer and/or of the carrier substrate) less than that of the carrier substrate, e.g. less than half the magnitude thereof, e.g. less than 10% of the magnitude thereof, e.g. less than 1% of the magnitude thereof.

The electrical potential applied at the electrically conductive layer can be an electrostatic potential (invariable over time).

In accordance with various embodiments, the electrically conductive layer can be metallic, e.g. including or formed from a metallic material (e.g. an organic metal, an inorganic metal, an alloy, e.g. an intermetallic compound). The term "metallic" (e.g. relative to a body, a material or a region, a layer, e.g. the electrically conductive layer) can be understood as having metallic properties, e.g. a metallic bond, mobile (delocalized) electrons in the metal lattice, electrical conductivity, metallic luster and/or ductility. In accordance with various embodiments, a semiconductor (e.g. a semiconductor material) or "electrically semiconducting" (e.g. relative to a body, a layer, a material or a region) can be understood as having a mediocre electrical conductivity, e.g. an electrical conductivity (e.g. measured at room temperature and with a uniform electric field) in a range of approximately $10^{-9}$ siemens/m (S/m) to approximately $10^4$ S/m. An electrical conductor or "electrically conductive" (e.g. relative to a body, a layer, a material or a region) can be understood as having a good electrical conductivity, e.g. an electrical conductivity (e.g. measured at room temperature and with a uniform electric field) of more than approximately $10^4$ S/m, e.g. more than approximately $10^3$ S/m, e.g. more than approximately $10^6$ S/m, e.g. more than approximately $10^7$ S/m. An electrical insulator or "electrically insulating" (e.g. relative to a body, a layer, a material or a region) can be understood as having a poor electrical conductivity, e.g. an electrical conductivity (e.g. measured at room temperature and with a uniform electric field) of less than approximately $10^{-9}$ S/m, e.g. less than approximately $10^{-12}$ S/m.

In accordance with various embodiments, the carrier substrate can be electrically insulating (e.g. dielectric). By way of example, the carrier substrate may include or be formed from an electrically insulating (e.g. dielectric) material (in other words an electrical insulator).

In accordance with various embodiments, the electrical potential at the electrically conductive layer can be regulated and/or controlled (e.g. by means of a potential generator). Alternatively or additionally, the electrical potential at the electrically conductive layer can be provided by means of a charge store (e.g. by means of an electrical ground and/or by means of a potential generator) which has e.g. a greater charge storage capability (e.g. capacity) than the electrically conductive layer. By way of example, the electrically conductive layer can be electrically conductively connected to the charge store, e.g. before and/or during the process of forming the at least one organic, functional layer.

In accordance with various embodiments, applying the electrical potential to the electrically conductive layer can bring about a potential equalization (e.g. with a reference potential, e.g. electrical ground). In this case, electrical charges can flow away from or toward the electrically conductive layer, that is to say that an electric current flow can be brought about (e.g. a current pulse). The potential equalization can provide an electrostatic potential for the electrically conductive layer (that is to say that the potential equalization is temporally delimited, e.g. to a potential equalization pulse).

In accordance with various embodiments by means of applying the electrical potential to the electrically conductive layer, it is possible to remove an (e.g. dielectric) material and/or (e.g. dielectric) particles (e.g. dust) from the electrically conductive layer. Alternatively or additionally, by means of applying the electrical potential to the electrically conductive layer, coating of the electrically conductive layer with the material and/or the particles (e.g. dust) can be reduced.

In accordance with various embodiments, applying the electrical potential to the electrically conductive layer can reduce (e.g. bring to zero) an electric field strength at the organic component (e.g. at the electrically conductive layer and/or at the carrier substrate). In other words, an electric field strength at the organic component can be reduced by means of applying the electrical potential to the electrically conductive layer. By way of example, applying the electrical potential to the electrically conductive layer can bring about a substantially field-free environment (of the organic component).

For applying the electrical potential to the electrically conductive layer, the electrically conductive layer can be electrically contacted, e.g. by means of electrical contacts (e.g. by means of grounding contacts). The electrical contacts (can also be referred to as contacting device) can be installed in a tool which holds the carrier substrate during the process of forming at least one organic, functional layer.

In accordance with various embodiments, forming the at least one organic, functional layer can be carried out in a potential-free fashion and/or from a solution (e.g. with volatilization of a solvent). In accordance with various embodiments, the at least one organic, functional layer can be applied by means of liquid phase processing, i.e. as or from a solution.

In accordance with various embodiments, forming the at least one organic, functional layer can be carried out while the electrical potential is applied to the electrically conductive layer. By way of example, the electrical potential can be applied to a device for forming the at least one organic, functional layer (e.g. such that a field-free space is produced therebetween).

During liquid phase processing, the material of a layer (layer material), e.g. of the organic, functional layer, can be dissolved in a solvent in order to form a liquid phase of the layer (also referred to as solution). Furthermore, forming the layer may include applying the liquid phase of the layer to an area to be coated (e.g. to the carrier substrate or to some other layer of the organic component) by means of liquid phase deposition (also referred to as wet-chemical method or wet-chemical coating). Furthermore, forming the layer may include drying the applied liquid phase of the layer by extracting the solvent from the liquid phase of the layer such that the liquid phase of the layer cures and is converted into a solid layer. In this case, the layer material that forms the solid layer can remain. In other words, the layer can be formed from the liquid phase of the layer.

Liquid phase deposition can be carried out for example by means of spray coating, curtain coating, slot die coating, inkjet printing or screen printing.

In accordance with one development, the electrically conductive layer is grounded during the process of applying the electrical potential. By means of grounding the electrically conductive layer, the potential difference between the at least one organic, functional layer and the particles from the environment can be minimized in a simple manner.

In accordance with one development, the method furthermore includes forming a first electrode and forming a second electrode, wherein the at least one organic, functional layer is formed between the first electrode and the second electrode.

In accordance with one development, the electrically conductive layer forms the first and/or the second electrode or the electrically conductive layer is formed as part of the first and/or the second electrode. As a result, the method is efficient since only a single layer is formed which serves as first electrode and also as electrically conductive layer, and/or a single layer is formed which serves as second electrode and also as electrically conductive layer.

In accordance with one development, the first electrode and/or the second electrode are/is formed as transparent or translucent.

In accordance with one development, the method furthermore includes forming an encapsulation on or above the second electrode.

In accordance with one development, the encapsulation is formed from a metal or the encapsulation is formed in such a way that it includes a metal. A metallic encapsulation has a high electrical conductivity. Therefore, during the process of forming the encapsulation, an electrical potential can be applied to the layer arranged below the encapsulation, for example to the second electrode, in order to reduce the contamination of the encapsulation by particles from the environment.

In accordance with one development, an electrical potential is applied to the electrically conductive layer at least partly during the process of forming the first electrode, the second electrode and/or the encapsulation. It is thus possible to form a first electrode, a second electrode and/or an encapsulation with a small number of defects caused by particles.

In accordance with one development, the method furthermore includes providing a covering substrate. Furthermore, the method includes forming a further electrically conductive layer on the covering substrate. Furthermore, the method includes applying an electrical potential to the further electrically conductive layer. Furthermore, the method includes forming an adhesion-medium layer on or above the covering substrate at least partly during the process of applying the electrical potential to the further electrically conductive layer. Furthermore, the method includes connecting the carrier substrate to the covering substrate by means of the adhesion-medium layer. By applying an electrical potential during the process of forming the adhesion-medium layer, it is possible to minimize a potential difference between the adhesion-medium layer and particles from the environment. It is thus possible to reduce the electrostatic attraction of the particles from the environment by the adhesion-medium layer.

In accordance with one development, connecting the carrier substrate to the covering substrate includes cohesively connecting the adhesion-medium layer to the encapsulation.

In accordance with one development, forming the adhesion-medium layer includes admixing an electrically conductive material into the adhesion-medium layer. By admixing an electrically conductive material into the adhesion-medium layer, it is possible to increase the electrical conductivity of the adhesion-medium layer. Consequently, during the process of forming the adhesion-medium layer, an electrical potential can be applied to the further electrically conductive layer in order to reduce the contamination of the adhesion-medium layer by particles from the environment.

In accordance with one development, at least one further organic component is formed on the carrier substrate and alongside the organic component.

In accordance with one development, the organic component and the at least one further organic component are electrically conductively connected to one another by means of the electrically conductive layer. By connecting the organic component to the at least one further organic component by means of the electrically conductive layer, it is possible, in a simple manner, to apply the same electrical potential to all organic components arranged on the carrier substrate.

In accordance with one development, the method furthermore includes separating the organic component from the at least one further organic component by means of severing the carrier substrate between the organic component and the at least one further organic component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 6 shows a plan view of an organic component in a method for producing an organic component;

FIG. 7 shows a plan view of an organic component in a method for producing an organic component;

DETAILED DESCRIPTION

In the following detailed description, reference is made to the accompanying drawings, which form part of this description and show for illustration purposes specific exemplary embodiments in which the present disclosure can be implemented. It goes without saying that other exemplary embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, the term "translucent" or "translucent layer" can be understood to mean that a layer or a material is transmissive to light, for example to the light generated by the electromagnetic radiation source, for example in one or a plurality of wavelength ranges, for example to light in a wavelength range of visible light (for example at least in a subrange of the wavelength range of 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a subrange of the wavelength range of 380 nm to 780 nm), wherein light coupled into a structure (for example a layer) is also coupled out from the structure (for example layer) without scattering or light conversion.

Figure 1:
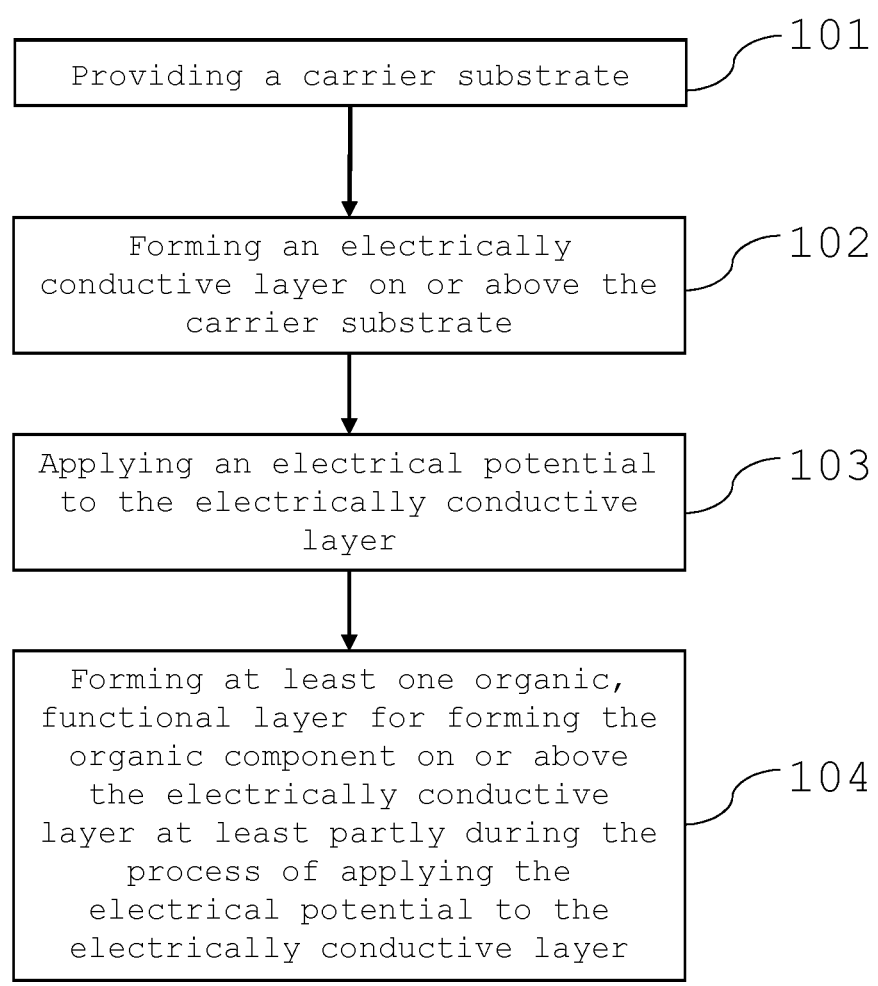
FIG. 1 shows a flow diagram of a method for producing an organic component.

FIG. 1 shows a flow diagram of a method for producing an organic component.

Figure 2A:
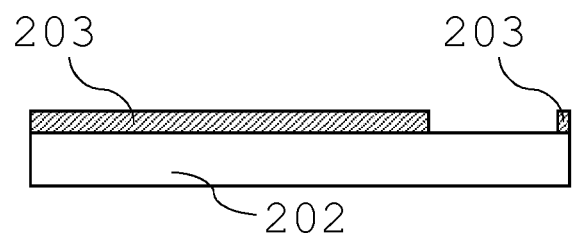
FIG. 2A shows a cross-sectional view of an organic component in a method for producing an organic component.

The method for producing an organic component includes providing 101 a carrier substrate 202, for example illustrated in FIG. 2A. Furthermore, the method includes forming 102 an electrically conductive layer 203, for example illustrated in FIG. 2A, on or above the carrier substrate 202 and applying 103 an electrical potential to the electrically conductive layer 203. Furthermore, the method includes forming 104 at least one organic, functional layer 210, for example illustrated in FIG. 2C, for forming the organic component on or above the electrically conductive layer 203 at least partly during the process of applying the electrical potential to the electrically conductive layer 203.

The organic component can be formed as an optoelectronic component which emits or absorbs light. The organic component can be formed as an organic light emitting diode (OLED), a photodetector or a solar cell. The organic component may include for example one, two or more light emitting diode elements. The light emitting diode elements can be for example organic light emitting diodes or parts or segments of organic light emitting diodes.

In 101, the carrier substrate 202 is provided. The carrier substrate 202 can be formed as translucent or transparent. The carrier substrate 202 serves as a carrier element for electronic elements or layers, for example light emitting elements. The carrier substrate 202 may include or be formed from, for example, plastic, metal, glass, quartz and/or a semiconductor material. Furthermore, the carrier substrate 202 may include or be formed from a plastics film or a laminate including one or a plurality of plastics films. The carrier substrate 202 can be formed as mechanically rigid or mechanically flexible.

In accordance with one embodiment, a first barrier layer, for example a first barrier thin-film layer, is formed on the carrier substrate 202. The first barrier layer serves to protect elements formed on the carrier substrate 202 against harmful external influences such as oxygen and/or moisture.

In 102, the electrically conductive layer 203 is formed on or above the carrier substrate 202.

The electrically conductive layer 203 is formed in such a way that it includes an electrically conductive material, for example a metal and/or a transparent conductive oxide (TCO) or a layer stack of a plurality of layers including metals or TCOs. The electrically conductive layer 203 can be formed in such a way that it includes a layer stack of a combination of a layer of a metal on a layer of a TCO, or vice versa. One example is a silver layer applied on an indium tin oxide layer (ITO) (Ag on ITO) or ITO-Ag-ITO multilayers. As an alternative or in addition to the materials mentioned, the electrically conductive layer can be formed in such a way that the electrically conductive layer includes at least one of the following materials: networks composed of metallic nanowires and nanoparticles, for example composed of silver, networks composed of carbon nanotubes and/or graphene particles and graphene layers.

In accordance with one embodiment, the electrically conductive layer 203 is formed on a surface, for example a main processing surface, of the carrier substrate 202, for example on the entire main processing surface. The electrically conductive layer 203 can be formed as a continuous layer over a large area on the entire main processing surface of the carrier substrate 202.

In accordance with one embodiment, the electrically conductive layer 203 is formed on the carrier substrate 202 in a structured fashion, for example by means of optical lithography and/or using a shadow mask.

The electrically conductive layer 203 can be formed on or above the carrier substrate 202 by means of physical vapor deposition, for example by means of sputtering, by means of thermal evaporation and/or electron beam evaporation. The electrically conductive layer 203 can be formed on or above the carrier substrate by means of spin coating, dip coating, spray coating and/or curtain coating.

In 103, the electrical potential is applied to the electrically conductive layer 203.

In accordance with one embodiment, the electrical potential is a suitable reference potential, for example the ground potential, for example 0 V.

In other words, the electrically conductive layer 203 is grounded during the process of applying 103 the electrical potential.

In 104, the at least one organic, functional layer 210 for forming the organic component is formed on or above the electrically conductive layer 203, wherein the organic, functional layer 210 is formed at least partly during the process of applying 103 the electrical potential to the electrically conductive layer 203.

In accordance with one embodiment, the electrical potential is applied during the entire time period of forming 104 the at least one organic, functional layer 210.

The at least one organic, functional layer 210 is formed in such a way that it includes at least one organic substance, for example an organic semiconductor and/or an organic conductor.

In accordance with the case where the organic component is formed as an organic light emitting diode, the at least one organic, functional layer 210 can be formed as a hole injection layer, a hole transport layer, an emitter layer, an electron transport layer and/or an electron injection layer. The hole injection layer serves for reducing the band gap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the band gap between second electrode and electron transport layer. The organic, functional layer can be formed as translucent or transparent.

In accordance with one embodiment, the at least one organic, functional layer 210 is formed as part, or as a partial layer, of an organic, functional layer structure. The organic, functional layer structure can be formed in such a way that the organic functional layer structure includes one, two or more functional layer structure units, wherein the functional layer structure units include in each case the abovementioned partial layers and/or further intermediate layers.

An organic component may include a plurality of layers, wherein the layers can be formed one above another, for example, during the production of the organic component. Conventionally, the layers are electrically insulated from the ground potential during the production of the organic component, which can entail an electrostatic charging. As a result, particles from the environment can be attracted to an intensified extent. By means of applying 103 an electrical potential to the electrically conductive layer 203 during the process of forming 104 the at least one organic, functional layer 210, this can make it possible for an existing potential difference between the at least one organic, functional layer 210 and the particles from the environment, for example dust particles from the environment, to be reduced, for example even minimized. Consequently, it is possible to reduce an electrostatic attraction between the particles from the environment and the at least one organic, functional layer 210. An organic component produced in this way can have a smaller number of defects caused by particles. The grounding of the electrically conductive layer 203 makes it possible, in a simple manner, to reduce, for example to minimize, the potential difference between the at least one organic, functional layer 210 and the particles from the environment. An electrostatic charging of the carrier substrate 202 during the production of the organic component, for example of the OLED, can be avoided. Particles can be attracted to a lesser extent or no longer attracted. Consequently, the particle burden is reduced and the yield of the organic components or the quality of the organic components increases.

Figure 2B:
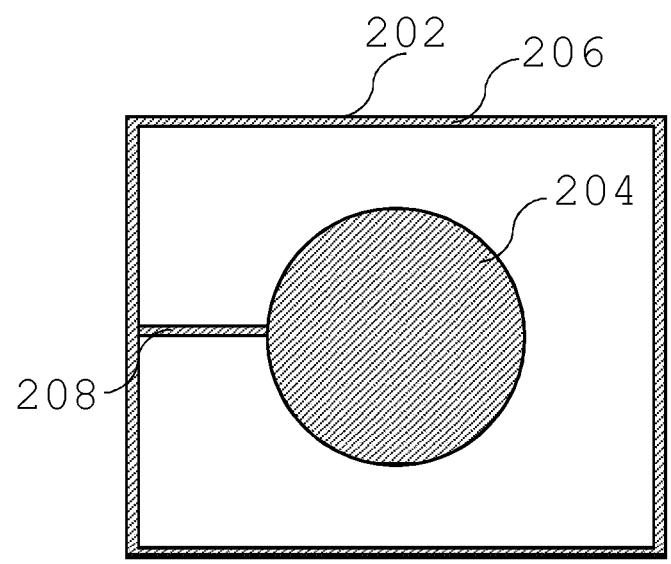
FIG. 2B shows a plan view of an organic component in a method for producing an organic component.

FIG. 2A shows a cross-sectional view and FIG. 2B shows a plan view of an organic component in a method for producing an organic component.

FIG. 2A shows a carrier substrate 202 with an electrically conductive layer 203 formed on the carrier substrate 202. The electrically conductive layer 203 can be formed in such a way that it includes a plurality of partial regions, for example by means of optical lithography or by means of a shadow mask. By way of example, the electrically conductive layer 203 can be formed in such a way that it includes a component area 204, wherein the organic component is intended to be formed on the component area. Furthermore, the electrically conductive layer 203 can be formed in such a way that it includes at least one contact area 206 and at least one connection area 208. The at least one connection area 208, also referred to hereinafter as at least one connection line 208, connects the at least one contact area 206 to the component area 204. The contact area 206, as illustrated in FIG. 2B, can be formed in an edge region of the carrier substrate 202. The contact area 206 can have the form of a frame. A contact area 206 formed in a frame-shaped fashion can also be referred to hereinafter as a contact frame 206. The contact area 206 can be formed on the carrier substrate 202 and circumferentially around the entire edge region of the carrier substrate 202. By means of a contact frame 206 formed in this way, electrical contacting is simplified since the electrical contacting can be carried out on the entire edge region of the carrier substrate 202.

In accordance with one embodiment, the contact area 206 is formed in such a way that it includes a plurality of contact pads instead of or in addition to the circumferential contact frame 206.

The carrier substrate 202 can be embodied with an electrically conductive layer 203, also referred to hereinafter as electrically conductive coating 203, and with at least one connection line 208, also referred to hereinafter as at least one electrical connection line 208, to one or a plurality of contact areas, wherein the one or the plurality of contact areas are grounded during the storage, transport and/or production of the organic component.

Figure 2C:
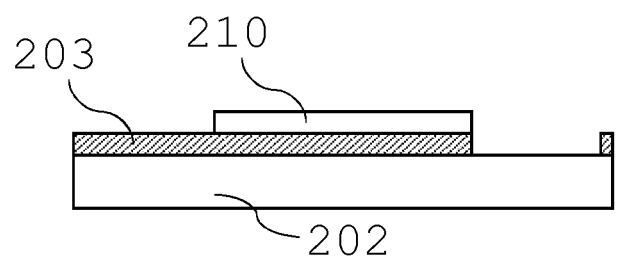
FIG. 2C shows a cross-sectional view of an organic component in a method for producing an organic component.

FIG. 2C shows a cross-sectional view of an organic component in a method for producing an organic component.

The at least one organic, functional layer 210 is formed on the electrically conductive layer 203.

In accordance with one embodiment, the at least one organic, functional layer 210 is formed on the component area 204 of the electrically conductive layer 203. The organic, functional layer 210 can be formed on the component area 204 in such a way that that region of the carrier substrate 202 which is free of the component area 204 is free of the organic, functional layer 210.

In accordance with one development, the method furthermore includes forming a first electrode 312 and forming a second electrode 314, wherein the at least one organic, functional layer 316 is formed between the first electrode 312 and the second electrode 314.

Figure 3:
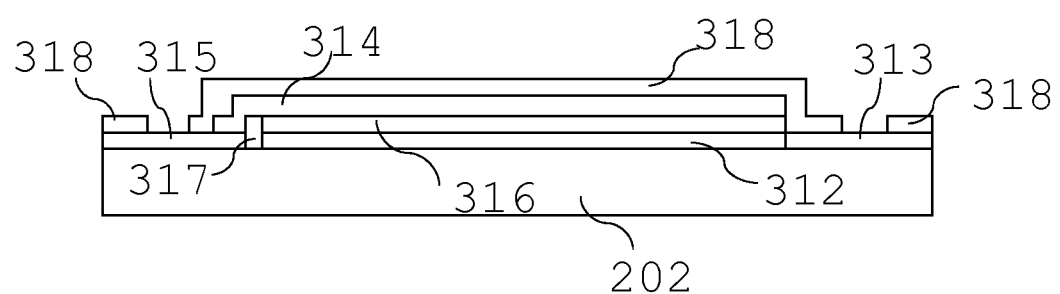
FIG. 3 shows a cross-sectional view of an organic component in a method for producing the organic component.

FIG. 3 shows a cross-sectional view of an organic component in a method for producing an organic component.

As illustrated in FIG. 3, the first electrode 312 is formed on or above the carrier substrate 202.

The first electrode 312 can be formed as an anode or as a cathode. In accordance with one embodiment, the first electrode 312 is formed as translucent or transparent. The first electrode 312 can be formed in such a way that it includes an electrically conductive material, for example a metal and/or a transparent conductive oxide or a layer stack of a plurality of layers including metals or TCOs. The first electrode 312 can be formed for example in such a way that it includes a layer stack of a combination of a layer of a metal on a layer of a TCO, or vice versa. One example is a silver layer applied on an indium tin oxide layer (ITO) (Ag on ITO) or ITO-Ag-ITO multilayers. The first electrode 312 can be formed in such a way that the first electrode 312 includes as an alternative or in addition to the materials mentioned: networks composed of metallic nanowires and nanoparticles, for example composed of silver, networks composed of carbon nanotubes, graphene particles and graphene layers and/or networks composed of semiconducting nanowires.

In accordance with one embodiment, a first contact section 313 is formed alongside the first electrode 312. The first contact section 313 is formed in such a way that it is in direct (physical) contact with the first electrode 312. The first contact section 313 serves for electrically contacting the first electrode 312. The first contact section 313 can be formed at the same time as the first electrode 312. The first contact section can be formed from the same materials as the first electrode 312. The first contact section 313 can also be referred to hereinafter as contact pad 313 of the first electrode.

In accordance with one embodiment, the first electrode 312 is formed on or above the electrically conductive layer 203 (not illustrated in FIG. 3).

In accordance with one embodiment, the first electrode 312 is formed on the component area 204 of the electrically conductive layer 203. The first electrode 312 can be formed on the component area 204 in such a way that that region of the carrier substrate 202 which is free of the component area 204 is likewise free of the first electrode 312.

In accordance with one embodiment, the electrical potential is applied to the electrically conductive layer 203 at least partly during the process of forming the first electrode 312.

In accordance with one embodiment, the electrically conductive layer 203 is grounded during the process of forming the first electrode 312 on or above the electrically conductive layer 203. Consequently, it is possible to form the first electrode 312 with a reduced number of particles from the environment. A first electrode 312 formed in this way may have no or only a few defects caused by particles.

In accordance with one embodiment, the electrical potential is applied during the entire period of time for forming 104 the first electrode 312.

In accordance with one embodiment, the electrically conductive layer 203 forms the first electrode 312 or the electrically conductive layer 203 is formed as part of the first electrode 312. As a result, the method becomes even more efficient since both the first electrode 312 and the electrically conductive layer 203 can be formed jointly in just one method step.

As shown in FIG. 3, the at least one organic, functional layer 316 is formed on the first electrode 312.

The at least one organic, functional layer is an electrically and/or optically active region. The active region is for example that region of the organic component in which electric current for the operation of the organic component flows and/or in which electromagnetic radiation is generated or absorbed. A getter structure (not illustrated) can be arranged on or above the active region. The getter layer can be formed as translucent, transparent or opaque. The getter layer can be formed in such a way that it includes a material which absorbs and binds substances that are harmful to the active region.

The second electrode 314 is formed in accordance with an embodiment of the first electrode 312 as described further above, wherein the first electrode 312 and the second electrode 314 can be formed identically or differently. The first electrode 312 serves for example as an anode or a cathode of the optoelectronic layer structure. The second electrode 314 serves, in a manner corresponding to the first electrode 314, as a cathode or an anode, respectively, of the at least one optoelectronic layer or the optoelectronic layer structure.

In accordance with one embodiment, the second electrode 314 is formed as transparent or translucent.

In accordance with one embodiment, and as illustrated in FIG. 3, a second contact section 315 is formed alongside the first electrode 312. The second electrode 314 is formed in such a way that it is in direct contact with the second contact section 315. The second contact section 315 serves for electrically contacting the second electrode 314. The second contact section 315 can be formed at the same time as the first electrode 312. The second contact section can be formed from the same materials as the first electrode 312. The second contact section 315 can also be referred to hereinafter as contact pad 315 of the second electrode. The first electrode 312 is electrically insulated from the second contact section 315 by means of an electrical insulation barrier 317.

In accordance with one embodiment, the second electrode 314 is formed on the component area 204 of the electrically conductive layer 203. The second electrode 314 can be formed on the component area 204 in such a way that that region of the carrier substrate 202 which is free of the component area 204 is likewise free of the second electrode 314.

In accordance with one embodiment, the electrical potential is applied to the electrically conductive layer 203 at least partly during the process of forming the second electrode 314.

In accordance with one embodiment, the electrically conductive layer 203 is grounded during the process of forming the second electrode 314 above the electrically conductive layer 203. Consequently, it is possible to form the second electrode 314 with a reduced number of particles from the environment. A second electrode 314 formed in this way may have no or only a few defects caused by particles.

In accordance with one embodiment, the method furthermore includes forming an encapsulation 318 on or above the second electrode 314.

The encapsulation 318, also referred to as encapsulation layer 318, is formed on or above the second electrode 314 and partly above the first contact section 313 and partly above the second contact section 315. The encapsulation 318 encapsulates the at least one organic, functional layer. The encapsulation layer 318 can be formed as a second barrier layer, for example as a second barrier thin-film layer. The encapsulation layer 318 can also be referred to as thin-film encapsulation 318. The encapsulation layer 318 forms a barrier vis à vis chemical contaminants and/or atmospheric substances, in particular vis à vis water (moisture) and oxygen. The encapsulation layer 318 can be formed as a single layer, a layer stack or a layer structure. The encapsulation layer 318 can be formed in such a way that it includes or is formed from the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, a carbide, for example silicon carbide or other carbide compounds, poly(p-phenylene terephthalamide), Nylon 66, and mixtures and alloys thereof. If appropriate, the first barrier layer can be formed on the carrier substrate 202 in a manner corresponding to a configuration of the encapsulation layer 318.

In accordance with one embodiment, in the encapsulation layer 318, a first cutout of the encapsulation layer 318 is formed above the first contact section 313 and a second cutout of the encapsulation layer 318 is formed above the second contact section 315. A first contact region of the first contact section 313 is exposed in the first cutout of the encapsulation layer 318 and a second contact region of the second contact section 315 is exposed in the second cutout. The first contact region serves for electrically contacting the first contact section 313 and the second contact region serves for electrically contacting the second contact section 315.

In accordance with one embodiment, the encapsulation 318 is formed from a metal or the encapsulation 318 is formed in such a way that it includes a metal. A metallic encapsulation 318 has a high electrical conductivity. Therefore, during the process of forming the encapsulation 318, an electrical potential can be applied to the layer arranged below the encapsulation, for example to the second electrode 312, in order to reduce the contamination of the encapsulation 318 by particles from the environment.

In accordance with one embodiment, the electrical potential is applied to the electrically conductive layer 203 at least partly during the process of forming the encapsulation 318.

In accordance with one embodiment, the electrically conductive layer 203 is grounded during the process of forming the encapsulation 318 above the electrically conductive layer 203. Consequently, it is possible to form the encapsulation 318 with a reduced number of particles from the environment. An encapsulation 318 formed in this way may have no or only a few defects caused by particles.

The organic component, for example the OLED, should be constructed as far as possible from electrically conductive layers. By way of example, the encapsulation 318 can be formed from a thick metal layer, instead of a thin layer, wherein thin encapsulation layers are usually formed by means of CVD and include silicon nitride, silicon carbite, silicon oxide or similar materials or nonconducting adhesive materials.

Figure 4:
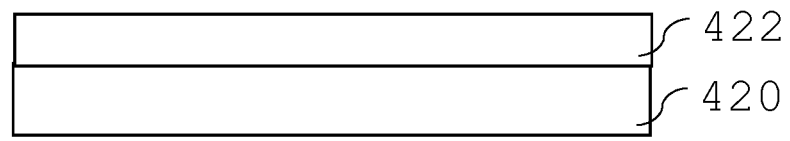
FIG. 4 shows a cross-sectional view of an organic component in a method for producing the organic component.

FIG. 4 shows a cross-sectional view of a covering substrate 420 with an adhesion-medium layer 422 in a method for producing an organic component.

In accordance with one development, the method furthermore includes providing a covering substrate 420. Furthermore, the method includes forming a further electrically conductive layer 834 (not illustrated) on the covering substrate 420. The further electrically conductive layer 834 is illustrated for example in FIG. 8. Furthermore, the method includes applying an electrical potential to the further electrically conductive layer 834. Furthermore, the method includes forming an adhesion-medium layer 422 on or above the covering substrate at least partly during the process of applying the electrical potential to the further electrically conductive layer 834. Furthermore, the method includes connecting the carrier substrate to the covering substrate by means of the adhesion-medium layer.

In accordance with one embodiment, applying the electrical potential to the further electrically conductive layer 834 is configured like applying the electrical potential to the electrically conductive layer 203. By applying the electrical potential during the process of forming the adhesion-medium layer 422, it is possible to minimize a potential difference between the adhesion-medium layer 422 and particles from the environment. Consequently, this can result in a reduction of the electrostatic attraction of particles from the environment by the adhesion-medium layer 422.

In accordance with one embodiment, the adhesion-medium layer 422 is formed in such a way that it includes an adhesion medium, for example an adhesive, for example a lamination adhesive, a lacquer and/or a resin. Furthermore, the adhesion-medium layer 422 can be formed in such a way that it includes particles which scatter electromagnetic radiation, for example light-scattering particles.

In accordance with one embodiment, the adhesion-medium layer 422 can be formed in such a way that it includes a lamination adhesive. An electrically conductive adhesive, for example a silver conductive adhesive, can be used as lamination adhesive. Alternatively, the lamination adhesive can be admixed with conductive particles, for example carbon black.

The adhesion-medium layer 422 is formed on or above the covering substrate 420. The adhesion-medium layer 422 serves for securing the covering body 420 on the encapsulation layer 318. The covering substrate 420 can be formed in such a way that it includes a plastic, a glass and/or a metal. By way of example, the covering substrate 420 can substantially be formed from glass and include a thin metal layer, for example a metal film, and/or a graphite layer, for example a graphite laminate, on the glass body. The covering substrate 420 serves for protecting the organic component, for example from mechanical force influences from outside. Furthermore, the covering substrate 420 can serve for spreading and/or dissipating heat generated in the organic component. By way of example, the glass of the covering substrate 420 can serve as protection from external influences and the metal layer of the covering substrate 420 can serve for spreading and/or dissipating the heat that arises during the operation of the organic component. In accordance with one embodiment, the covering substrate 420 is formed like the carrier substrate 202 described further above.

In accordance with one embodiment, forming the adhesion-medium layer 422 includes admixing an electrically conductive material into the adhesion-medium layer 422. By admixing an electrically conductive material into the adhesion-medium layer 422, it is possible to increase the electrical conductivity of the adhesion-medium layer 422. Consequently, during the process of forming the adhesion-medium layer 422, an electrical potential can be applied to the further electrically conductive layer 834 in order to reduce the contamination of the adhesion-medium layer 422 by particles from the environment.

In accordance with one embodiment, the electrical potential is applied to the further electrically conductive layer during the entire period of time for forming the adhesion-medium layer 422.

In accordance with one embodiment, the further electrically conductive layer 203 is grounded during the process of forming the adhesion-medium layer 422 on or above the further electrically conductive layer 203.

In accordance with one embodiment, connecting the carrier substrate to the covering substrate includes cohesively connecting the adhesion-medium layer 422 to the encapsulation 318.

Figure 5:
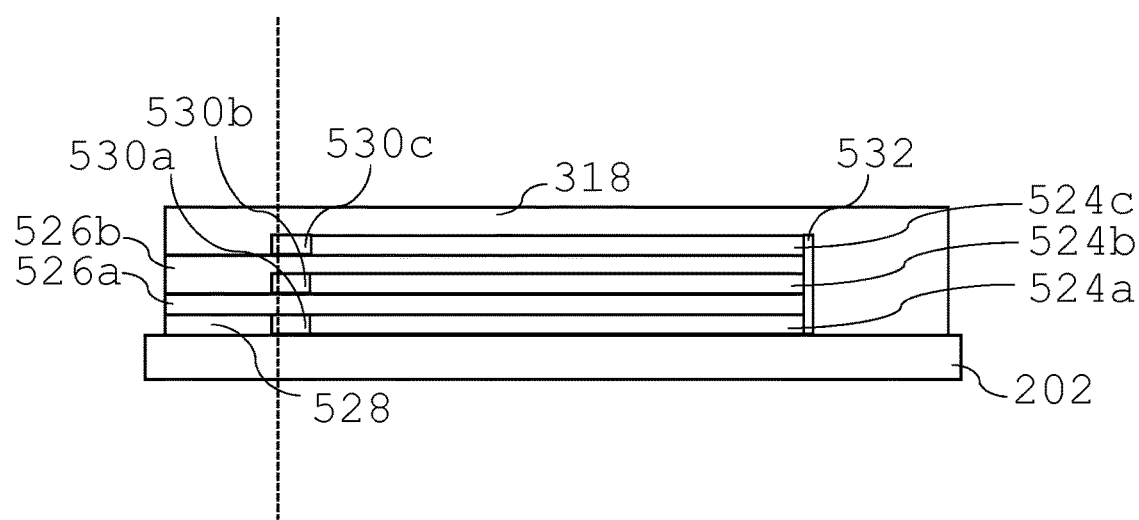
FIG. 5 shows a cross-sectional view of an organic component in a method for producing the organic component.

FIG. 5 shows a cross-sectional view of an organic component in a method for producing an organic component.

In accordance with one embodiment, the method includes providing the carrier substrate 202. The electrically conductive layer 203 (not illustrated) is formed on or above the carrier substrate 202. A first layer 524a is formed on the component area 204 of the electrically conductive layer 203. The first layer 524a can be formed like one of the layers described further above; by way of example, the first layer can be formed like the at least one organic, functional layer 210. The electrically conductive layer 203 can be grounded before or during the process of forming the first layer 524a. The grounding of the electrically conductive layer 203 can exist during the entire period of time required for forming the first layer 524a. The first layer 524a can be grounded by means of the grounding of the electrically conductive layer 203. Furthermore, a second layer 524b can be formed on the first layer 524a. The second layer 524b can be formed like one of the layers described further above; by way of example, the second layer 524b can be formed like the at least one organic, functional layer 210. The electrically conductive layer 203 can be grounded before or during the process of forming the second layer 524b. The grounding of the electrically conductive layer 203 can exist during the entire period of time required for forming the second layer 524b. The second layer 524b can be grounded by means of the grounding of the electrically conductive layer 203. In the case where the electrical leakage resistance of the first layer 524a is too high (for example if the leakage resistance is greater than or equal to 1 Gohm, for example greater than or equal to 1 Mohm, for example greater than or equal to 1 kohm) for the second layer 524b likewise to be grounded by means of the grounding of the electrically conductive layer 203, a first electrically conductive intermediate layer 526a can be formed between the first layer 524a and the second layer 524b. The first electrically conductive intermediate layer 526a may include those electrically conductive substances which are listed further above in association with the first electrode 312, or the materials of the hole injection layer or of the electron injection layer. Furthermore, a third layer 524c can be formed on the second layer 524b. The third layer 524c can be formed like one of the layers described further above; by way of example, the third layer can be formed like the second electrode 314. The electrically conductive layer 203 can be grounded before or during the process of forming the third layer 524c. The grounding of the electrically conductive layer 203 can exist during the entire period of time required for forming the second layer 524b. The third layer 524c can be grounded by means of the grounding of the electrically conductive layer 203. In the case where the electrical leakage resistance of the second layer 524b is too high (for example if the leakage resistance is greater than or equal to 1 Gohm, for example greater than or equal to 1 Mohm, for example greater than or equal to 1 kohm) for the third layer 524c likewise to be grounded by means of the grounding of the electrically conductive layer 203, a second electrically conductive intermediate layer 526b can be formed between the second layer 524b and the third layer 524c. The second electrically conductive intermediate layer 526b can be formed like the first electrically conductive intermediate layer 526b.

It should be noted that an electrically conductive intermediate layer which is formed like the above-described first electrically conductive intermediate layer 526a or like the second electrically conductive intermediate layer 526b can optionally also be formed between other layers. By way of example, a third electrically conductive intermediate layer (not illustrated) can be formed between the third layer 524c and a fourth layer (not illustrated) formed above the third layer 524c. In accordance with one embodiment, the electrically conductive intermediate layer can optionally be formed on respectively each of the layers of the organic component that have been described further above.

As an alternative to the above-described grounding of the electrically conductive layer 203, an electrical potential can be applied to the electrically conductive layer 203.

FIG. 5 furthermore illustrates a grounding contact 528, which is formed alongside the first layer 524a in accordance with one embodiment. The grounding contact 528 can be formed as part of the electrically conductive layer 203 or be electrically conductively connected to the electrically conductive layer 203. By way of example, the electrical potential, the ground potential or the grounding potential can be applied to the grounding contact 528.

An optional first insulation barrier 530a is arranged between the grounding contact 528 and the first layer 524a. The first insulation barrier 530a is formed in a manner adjoining a first side surface of the first layer 524a.

The first layer 524a includes two main surfaces and at least one side surface connecting the two main surfaces. By way of example, the first layer 524a can have approximately the shape of a parallelepiped. In this case, the first layer 524a has two main surfaces and four side surfaces arranged perpendicularly thereto. The surface normals of the two main surfaces of the first layer 524a are parallel to the surface normals of the main surface of the carrier substrate 202. In the case of thin layers, the size of the side surfaces can be negligibly small. FIG. 5 illustrates a cross-sectional view of an approximately parallelepipedal first layer. FIG. 5 shows a first layer having a first edge, which includes the first edge surface, and a second edge, which includes a second edge surface. The first electrically conductive intermediate layer 526a is formed partly on the grounding contact 528 in such a way that an electrical contact between the first electrically conductive intermediate layer 526a and the grounding contact 528 is formed. The second electrically conductive intermediate layer 526b is formed partly on the first electrically conductive intermediate layer 526a in such a way that an electrical contact between the first electrically conductive intermediate layer 526a and the second electrically conductive intermediate layer 526a is formed. An optional second insulation barrier 530b is arranged alongside the second layer 524b. The second insulation barrier 530b is formed in a manner adjoining a first side surface of the second layer 524b, wherein the second layer is configured geometrically like the first layer 524a. The third layer 524c is formed on the second electrically conductive intermediate layer 526b. The first layer 524a, the second layer 524b and the third layer 524c are formed one above another in such a way that they form a layer stack. An optional third insulation barrier 530c is arranged alongside the third layer 524c. The third insulation barrier 530c is formed in a manner adjoining a first side surface of the third layer 524c, wherein the third layer is configured geometrically like the first layer 524a. The first insulation barrier 530a, the second insulation barrier 530b and the third insulation barrier, if they are provided, are arranged approximately congruently one above another.

In accordance with the embodiment shown in FIG. 5, the encapsulation 318 is formed on the third layer 524c and on the optional third insulation barrier 530c. The encapsulation 318 is furthermore arranged on the second electrically conductive intermediate layer 526b in such a way that an electrical contact between the second electrically conductive intermediate layer 526b and the encapsulation 318 is formed. The encapsulation can furthermore partly be formed on the carrier substrate 202. Even though not illustrated in FIG. 5, in various embodiments a first electrode (for example anode) and a second electrode (cathode) are provided in the layer stack, wherein the second electrode is arranged on the third layer 524c and the encapsulation in this case is arranged on the second electrode.

As illustrated in FIG. 5, in accordance with one embodiment, the first electrically conductive intermediate layer 526a is formed as far as the second edge of the first layer 524a in such a way that the second edge surface of the first layer 524a is free of the first electrically conductive intermediate layer 526a and an edge of the first electrically conductive intermediate layer 526a adjoins the second edge of the first layer 524a. Furthermore, the second electrically conductive intermediate layer 526b is also formed as far as a second edge of the second layer 524b in such a way that a second edge surface of the second layer 524b is free of the second electrically conductive intermediate layer and an edge of the second electrically conductive intermediate layer 526b adjoins the second edge of the second layer 524b. An optional fourth insulation barrier 532 is formed alongside the second edge of the first layer 524a, the second layer 524b and the third layer 524c and alongside the edge of the first electrically conductive intermediate layer 526a and alongside the edge of the second electrically conductive intermediate layer 526b. The optional fourth insulation barrier 532 is formed in such a way that it laterally separates the encapsulation 318 from the first layer 424a, the second layer 424b, the third layer 424c, the first electrically conductive intermediate layer 426a and the second electrically conductive intermediate layer 426b.

A region of the carrier substrate 202 on or above which the grounding contact 528 is formed can also be referred to as grounding region. A region of the carrier substrate 202 on or above which the first insulation barrier 530a, the second insulation barrier 530b and the third insulation barrier 530c are formed can also be referred to as insulation region. The grounding region is formed alongside the insulation region. A region of the carrier substrate 202 on or above which the component area 204 of the electrically conductive layer 203, the first layer 424a, the second layer 424b and the third layer 424c are formed can be referred to as component region. In accordance with one embodiment, the grounding contact region is separated from the component region by means of severing of the carrier substrate 202 in the insulation region (illustrated by means of the dashed line in FIG. 5). Furthermore, the layers lying on or above the carrier substrate are also severed with the severing of the carrier substrate 202.

In accordance with one embodiment, directly after the process of forming a slightly electrically conductive layer such as, for example, an organic, functional layer, also referred to hereinafter as organic system, or a thin-film encapsulation (TFE), an electrically conductive intermediate layer, for example a metal, is formed on the slightly electrically conductive layer.

FIG. 6 shows a plan view of an organic component in a method for producing an organic component.

In accordance with one embodiment, at least one further organic component is formed on the carrier substrate 202 and alongside the organic component. FIG. 6 illustrates, for example, that four organic components are formed on the carrier substrate 202.

In accordance with one embodiment, the organic component and the at least one further organic component are connected to one another by means of the electrically conductive layer 203. The connection of the organic component to the at least one further organic component by means of the electrically conductive layer 203 makes it possible to apply the same electrical potential to all the organic components arranged on the carrier substrate. In this regard, by way of example, a plurality of organic components can be formed under the same electrostatic conditions.

FIG. 6 illustrates that the electrically conductive layer 203 is formed with the contact area 206, the component area 204, the at least one connection line 208, the first contact area 313 and the second contact area 315. The electrical insulation barrier 317 (not illustrated) can be arranged between the second contact area 315 and the component area. Furthermore, the electrically conductive layer 203 can be formed with a further first contact area 613b, which is formed with the first contact area 313 in accordance with one embodiment. The first contact area 313 and the further first contact area 613b can be arranged on opposite sides of the component area 204. Furthermore, the electrically conductive layer 203 can be formed with a further second contact area 615b, which is formed with the second contact area 615b in accordance with one embodiment. The second contact area 315 and the further second contact area 615b can be arranged on opposite sides of the component area 204.

The component area 204 with the first contact area 313, the further first contact area 613b, the second contact area 315 and the further second contact area 615b can be referred to as a component unit. As illustrated in FIG. 6, by way of example, four component units, a first component unit 617a, a second component unit 617b, a third component unit 617c and a fourth component unit 617d, can be arranged in a matrix form on the carrier substrate 202. In accordance with one embodiment, the first contact area 313 of the first component unit 617a is connected to the contact frame 206 by means of the at least one connection line 208. The further first contact area 613b of the first component unit 617a is connected to the first contact area 313 of the second component unit 617b by means of the at least one connection line 208. The further first contact area 613b of the second component unit 617b is connected to the further first contact area 613b of the third component unit 617c by means of the at least one connection line 208. The first contact area 313 of the second component unit 617b is connected to the first contact area 313 of the third component unit 617c by means of the at least one connection line 208. The first contact area 313 of the third component unit 617c is connected to the further first contact area 613b of the fourth component unit 617d by means of the at least one connection line 208. The first contact area 313 of the fourth component unit 617d is connected to the first contact area 313 of the first component unit 617a and to the contact frame 206.

In accordance with one embodiment, the contact area 206 is formed in such a way that it includes a plurality of contact pads instead of a circumferential contact frame.

The at least one connection line 208 can also be referred to hereinafter as conductor track 208.

The first contact area 313 and the further first contact area 613b can be referred to as anode or cathode contacts. In a manner corresponding thereto, the second contact area 315 and the further second contact area 615b can be referred to as cathode or anode contacts.

Conductor tracks or the electrically conductive layer, which may include a plurality of electrically conducting layers, connect(s) the individual components on the carrier substrate 202 to one or more contact pads or a circumferential contact frame. The anode and/or cathode contacts of the individual components can be utilized. Said conductor tracks can be led onto defined contact points at the edge of the carrier substrate 202, such that uniform contact is possible during the process and during storage.

The component area 204 shown in FIG. 6 is formed in such a way that it has an approximately circular shape. Alternatively, the component area can also have any other shape desired, for example an approximately rectangular shape as shown in FIG. 7.

In accordance with one embodiment, the method furthermore includes separating the organic component from the at least one further organic component by means of severing the carrier substrate 202 between the organic component and the at least one further organic component.

The severing of the carrier substrate 202 is illustrated by means of the dashed line in FIG. 6. By way of example, the carrier substrate 202 can be severed along the dashed line, for example by means of a sawing device, for example by means of a cutting device. The carrier substrate 202 is severed in such a way that only those regions remain which include the component area 204, the first contact area 313, the further first contact area 613b, the second contact area 315 and the further second contact area 615b.

FIG. 7 shows a plan view of an organic component in a method for producing an organic component.

As in FIG. 6, FIG. 7 shows a carrier substrate 202 on which four organic components are intended to be formed. In contrast to the embodiment illustrated in FIG. 6, the component area 204 in FIG. 7 is formed in an approximately rectangular fashion. The component area 204 is formed in such a way that it has two short sides and two long sides, wherein the first contact area 313, the second contact area 315 and the further second contact area 615b are arranged on one of the short sides. In accordance with one embodiment, the first contact areas 313 of the four component units are in each case connected to one another and to the contact frame 206 by means of the further electrically conductive layer.

Figure 8:
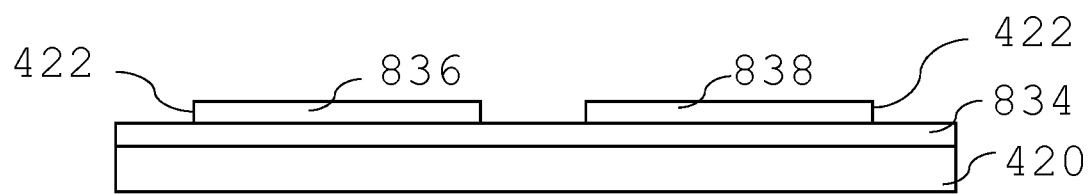
FIG. 8 shows a cross-sectional view of an organic component in a method for producing an organic component.

FIG. 8 shows a cross-sectional view of a covering substrate 420 with an adhesion-medium layer 422 in a method for producing an organic component.

The further electrically conductive layer 834 is arranged on the covering substrate 420. The adhesion-medium layer 422 is arranged on the further electrically conductive layer 834. The adhesion-medium layer 422 (not shown) is formed in such a way that it includes a first adhesion-medium region 836 and at least one second adhesion-medium region 838. The first adhesion-medium region 836 and the second adhesion-medium region 838 can be formed alongside one another.

In accordance with one embodiment, connecting the carrier substrate 202 to the covering substrate 420 includes cohesively connecting the first adhesion-medium region 836 to the encapsulation 318 of the organic component and cohesively connecting the at least one second adhesion-medium region 838 to the encapsulation 318 of the at least one further organic component.

In accordance with one embodiment, the encapsulation 318 is formed in such a way that the organic component and the at least one further organic component share the encapsulation 318.

Figure 9:
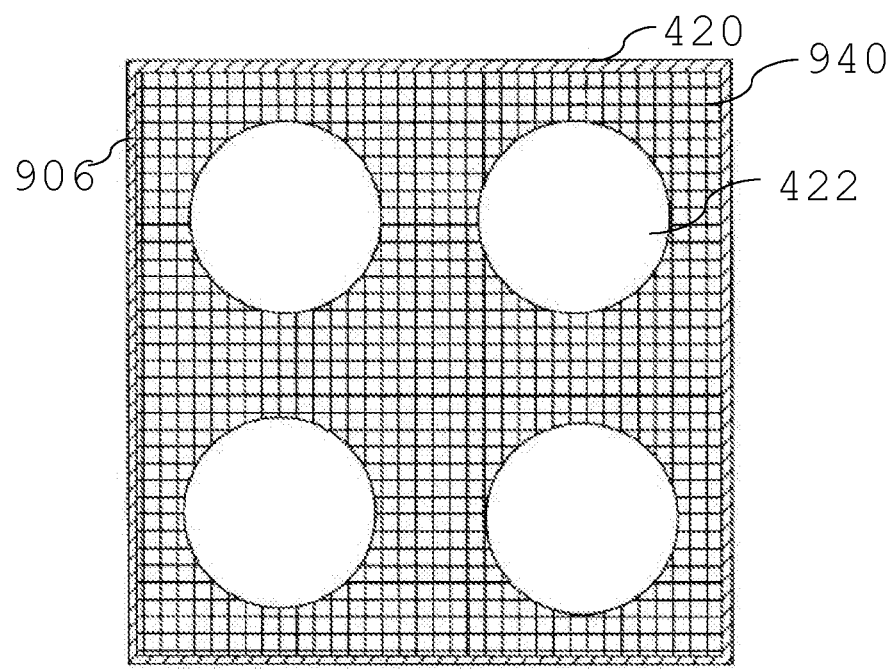
FIG. 9 shows a plan view of an organic component in a method for producing an organic component.

FIG. 9 shows a plan view of a covering substrate 420 with an adhesion-medium layer 422 in a method for producing an organic component.

In accordance with one embodiment, the electrically conductive layer 834 is formed from aluminum or ITO.

The further electrically conductive layer 834 can be formed in such a way that it includes a contact area 906, wherein the contact area 906 is formed in accordance with an embodiment of the contact frame 206 described further above. Furthermore, the further electrically conductive layer 834 may include a so-called conductor track network 940.

As illustrated in FIG. 9, the conductor track network 940 can be formed in such a way that it has horizontal and vertical lines on the covering substrate 420. The conductor track network 940 can approximately have the shape of a lattice.

In accordance with one embodiment, the electrically conductive layer 834 is formed as an uninterrupted, continuous layer over a large area on the covering substrate 420. The electrically conductive layer 834 can be formed on a main surface of the covering substrate 420. The electrically conductive layer 834 can be formed on the covering substrate 420 in such a way that the electrically conductive layer 834 completely covers at least one surface, for example the main surface, of the covering substrate 420. Consequently, by means of the further electrically conductive layer 834, an electrical contact between the first adhesion-medium region 836 and the at least one second adhesion-medium region 838 can be produced and a common electrical potential can be applied to the first adhesion-medium region 836 and to the at least one second adhesion-medium region 838.

The further electrically conductive layer 834 can be formed in accordance with an embodiment of the electrically conductive layer 203. By way of example, the further electrically conductive layer 834 can be formed like the electrically conductive layer 203. By way of example, the further electrically conductive layer 834 can be formed in such a way that it includes a component area, a contact area or a plurality of contact pads and at least one connection area, wherein the adhesion-medium layer 422 is intended to be formed on the component area of the further electrically conductive layer 834.

The covering substrate 420, for example glass, for example cap glass 420 or lamination glass 420, or one or a plurality of plastics films or some other suitable covering substrate, is provided in various embodiments. The further electrically conductive layer 834 can also be referred to hereinafter as electrically conductive coating 834. The contact area or the plurality of contact pads of the further electrically conductive layer 834 can be grounded during the storage, transport and/or production of the organic component. An electrostatic charging of the covering substrate 420 can be avoided during the production of the organic component, for example the OLED. Particles can be attracted to a lesser extent or can no longer be attracted. Consequently, the particle burden can be reduced and the yield of the organic components and/or the quality of the organic components can be increased.

Figure 10:
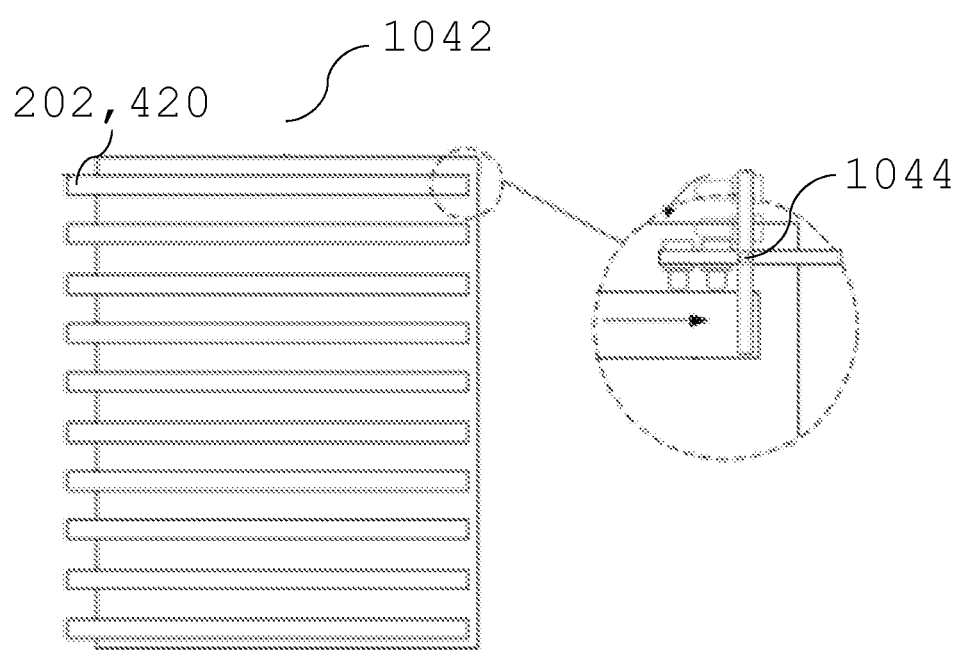
FIG. 10 shows a schematic illustration of a device for temporary storage in a method for producing an organic component.

FIG. 10 shows a schematic illustration of a device for temporary storage 1042 of a covering substrate 420 or of a carrier substrate 202 in a method for producing an organic component.

In accordance with one embodiment, the method for producing the organic component includes temporarily storing the covering substrate 420 and/or the carrier substrate 202.

The device for temporary storage 1042 is furthermore also referred to as a tray 1042 or transport cassette 1042.

In accordance with one embodiment, the carrier substrate 202, on which the electrically conductive layer 203 has already been formed, is arranged in the device for temporary storage 1042; by way of example, the carrier substrate 202 is pushed into the tray 1042. Furthermore, temporarily storing the carrier substrate 202 includes electrically contacting the electrically conductive layer 203. Contacting the electrically conductive layer 203 can be carried out by a contacting device 1044, for example. By way of example, the contacting device 1044 can be configured in such a way that an electrical contact with the contact area 206 of the electrically conductive layer 203 is formed when the carrier substrate 202 is pushed into the tray 1042. Contacting the covering substrate 420 can be carried out in an analogous manner. In accordance with one embodiment, the covering substrate 420 and/or the carrier substrate 202 are/is grounded during the temporary storage by means of the contacting device 1044.

In order to be able to ground the carrier substrate 202 and/or the covering substrate 420 during the entire production, temporary storage and storage, it may be necessary to install contacting devices 1044 in tools and auxiliaries. Auxiliaries are for example transport cassettes, transport carriages, handlers (for example for transport between cassette and process apparatus), robots and baking furnaces.

The present disclosure is not restricted to the embodiments indicated. By way of example, the embodiments shown in FIGS. 2A, 2B, 2C, 3, 4, 5, 6, 7, 8 and 9 can be combined with one another.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an organic component, the method comprising:
   providing a carrier substrate;
   forming an electrically conductive layer on or above the carrier substrate;
   applying an electrical potential to the electrically conductive layer; and
   forming at least one organic, functional layer on or above the electrically conductive layer at least partly during the process of applying the electrical potential to the electrically conductive layer, and
   wherein the organic, functional layer is electrically conducting layer of the formed organic component configured to directly conduct an electric current therethrough during operation of the organic component, and
   wherein at least one further organic component is formed on the carrier substrate and alongside the organic component.

2. The method as claimed in claim 1,
   wherein the electrically conductive layer is grounded during the process of applying the electrical potential.

3. The method as claimed in claim 1,
   wherein the organic component and the at least one further organic component are electrically conductively connected to one another by means of the electrically conductive layer.

4. The method as claimed in claim 1, further comprising:
   separating the organic component from the at least one further organic component by means of severing the carrier substrate between the organic component and the at least one further organic component.

5. The method as claimed in claim 1, further comprising:
   forming a first electrode; and
   forming a second electrode;
   wherein the at least one organic, functional layer is formed between the first electrode and the second electrode.

6. The method as claimed in claim 5,
wherein the electrically conductive layer is formed as part of the first electrode or forms the first electrode or is formed as part of the second electrode or forms the second electrode.

7. The method as claimed in claim 5,
wherein the first electrode and/or the second electrode are/is formed as transparent or translucent.

8. The method as claimed in claim 5, further comprising:
forming an encapsulation on or above the second electrode.

9. The method as claimed in claim 8, further comprising:
wherein the encapsulation is formed from a metal or the encapsulation is formed in such a way that it comprises a metal.

10. The method as claimed in claim 8,
wherein an electrical potential is applied to the electrically conductive layer at least partly during the process of forming the first electrode, the second electrode and/or the encapsulation.

11. The method as claimed in claim 8, further comprising:
providing a covering substrate;
forming a further electrically conductive layer on the covering substrate;
applying an electrical potential to the further electrically conductive layer;
forming an adhesion-medium layer on or above the covering substrate at least partly during the process of applying the electrical potential to the further electrically conductive layer; and
connecting the carrier substrate to the covering substrate by means of the adhesion-medium layer.

12. The method as claimed in claim 11,
wherein connecting the carrier substrate to the covering substrate comprises cohesively connecting the adhesion-medium layer to the encapsulation.

13. The method as claimed in claim 11,
wherein forming the adhesion-medium layer comprises admixing an electrically conductive material into the adhesion-medium layer.

\* \* \* \* \*